(12) United States Patent
Kovalenko et al.

(10) Patent No.: US 10,329,484 B2
(45) Date of Patent: Jun. 25, 2019

(54) LUMINESCENT COMPOSITE MATERIALS (71) Applicant: Avantama AG, Stäfa (CH)

(72) Inventors: Maksym Kovalenko, Zürich (CH); Norman Albert Lüchinger, Meilen (CH); Bogdan Benin, Kloten (CH); Dmitry Dirin, Zürich (CH)

(73) Assignee: Avantama AG, Stäfa (CH)

( * ) Notice: Subject to any disclaimer, the term of this patent is extended or adjusted under 35 U.S.C. 154(b) by 0 days.

(21) Appl. No.: 15/847,024

(22) Filed: Dec. 19, 2017

(65) Prior Publication Data
US 2018/0179440 A1 Jun. 28, 2018

(30) Foreign Application Priority Data

Dec. 22, 2016 (EP) .................................... 16206290

(51) Int. Cl.
*C09K 11/02* (2006.01)
*C09K 11/06* (2006.01)
*C09K 11/08* (2006.01)
*C09K 11/66* (2006.01)
*H01L 33/06* (2010.01)
*H01L 33/26* (2010.01)
*H01L 51/00* (2006.01)
*H01L 51/50* (2006.01)
*H01L 51/56* (2006.01)
*G02F 1/1335* (2006.01)

(52) U.S. Cl.
CPC ............ *C09K 11/665* (2013.01); *C09K 11/02* (2013.01); *C09K 11/06* (2013.01); *C09K 11/08* (2013.01); *H01L 51/0077* (2013.01); *C09K 2211/10* (2013.01); *G02F 1/133621* (2013.01); *G02F 2001/133614* (2013.01); *G02F 2202/36* (2013.01); *H01L 33/06* (2013.01); *H01L 33/26* (2013.01); *H01L 51/5012* (2013.01); *H01L 51/56* (2013.01)

(58) Field of Classification Search
CPC ......... C09K 11/02; C09K 11/06; C09K 11/88; C09K 11/665; C09K 11/7435; C09K 2211/1044; C09K 2211/1051; C09K 2211/1029
See application file for complete search history.

(56) References Cited

U.S. PATENT DOCUMENTS

| | | | | |
|---|---|---|---|---|
| 3,988,252 A | * | 10/1976 | Ferretti .............. | C09K 11/7791 252/301.4 H |
| 4,755,327 A | * | 7/1988 | Bernarducci ............ | C11D 1/72 510/319 |
| 4,830,875 A | * | 5/1989 | Lindmayer ............... | G01T 1/11 250/484.4 |
| 4,839,090 A | * | 6/1989 | Rosette .............. | C09K 11/0833 252/301.4 H |
| 4,855,606 A | * | 8/1989 | Walters ................ | B21D 43/021 250/548 |
| 5,882,548 A | | 3/1999 | Liang et al. | |
| 2008/0054223 A1 | | 3/2008 | Earle et al. | |

FOREIGN PATENT DOCUMENTS

CN     102 916 097 A     2/2013

OTHER PUBLICATIONS

Gubrenz et al, "Solid-State Anion Exchange Reactions for Color Tuning $CsPbX_3$ Perovskite Nanocrystals", Chem. Mater. vol. 28, Nov. 21, 2016, pp. 0933-9040.*
Guhrenz et al., "Solid-State Anion Exchange Reactions for Color Tuning of $CsPbX_3$ Perovskite Nanocrystals", Chemistry of Materials, vol. 28, 2016, pp. 9033-9040.
Extended European Search Report for corresponding European Application No. 16206290.5 dated Jun. 14, 2017.
CN 102 916 097 A, Database WPI, Week 201336, Sep. 8, 2013, Thomas Scientific, AN 2013-H35714, XP002770675.
Babin et al., "Polarized luminescence of $CsPbBr_3$ nanocrystals (quantum dots) in CsBr:Pb single crystal", Chemical Physics Letters 314, 1999, pp. 31-36.
Yang et al., "Reprecipitation Synthesis of Luminescent $CH_3NH_3PbBr_3$/$NaNO_3$ Nanocomposites with Enhanced Stability", Journal of Materials Chemistry C, 2013, pp. 1-7.

* cited by examiner

*Primary Examiner* — C Melissa Koslow
(74) *Attorney, Agent, or Firm* — Renner, Otto, Boisselle & Sklar, LLP (57) ABSTRACT

The present invention relates to the field of luminescent crystals (LCs), and provides for new composite materials, for methods of manufacturing the same and the use thereof. These new composite materials comprise LCs embedded in an inorganic salt, they are highly luminescent and highly stable. The invention further provides for formulations, components and devices comprising these composites.

16 Claims, 1 Drawing Sheet

LUMINESCENT COMPOSITE MATERIALS

The present invention relates to the field of luminescent crystals (LCs), and provides for new composite materials, for methods of manufacturing the same and the use thereof. These new composite materials comprise LCs embedded in an inorganic salt, they are highly luminescent and highly stable. The invention further provides for formulations, components and devices comprising these composites.

Luminescent Crystals, specifically Quantum Dots, are a known class of materials. Such LCs find many applications in industrial and commercial products, including optoelectronic devices, such as light emitting diodes or displays, lasers, photodetectors and photovoltaics.

Known LCs, particularly from the class of Perovskites, are susceptible towards oxygen and/or humidity. To address this issue, barrier films are applied. Such barrier films are considered disadvantageous, due to its costs and additional manufacturing steps.

Yang et al (*J. Mater. Chem. C*, 2016, DOI: 10.1039/C6TC04069A) disclose the synthesis of luminescent $CH_3NH_3PbBr_3/NaNO_3$ Nanocomposites with enhanced stability. The synthesis involves a re-precipitation process and the presence of capping agents. The use of both, capping agents and of large amounts of solvent, is a disadvantage of the synthesis disclosed therein. Yang also reports on the thermal stability, which decreases to 30% within 5 hrs of heat treatment at 100° C. Although this is an improvement over the pure LCs, the stability of the nanocomposites is still considered insufficient for many commercial applications.

Babin et al (Chemical Physics Letters 314 _1999. 31-36 disclose polarized luminescence of $CsPbBr_3$ nanocrystals in CsBr:Pb single crystal. Babin discusses the mechanism underlying photoluminescence. The materials disclosed in that document contain very low concentrations of luminescent material, 0.01 and 0.3 mol % are identified. The document also acknowledges that nanocrystals of different size are obtained by their synthetic protocol. Luminescence observed is very low and unsuited for commercial applications. The authors speculate about the use of such materials in measuring devices (scintillators).

Thus, it is an object of the present invention to mitigate at least some of these drawbacks of the state of the art. In particular, it is an aim of the present invention to provide luminescent materials that show high stability and high luminescence simultaneously, suitable for a wide variety of applications, including optoelectronic devices. It is also an aim to provide improved manufacturing methods of LCs, facilitating commercial production.

One or more of these objectives are achieved by a composite material including a matrix and embedded therein luminescent crystals, and a method for manufacturing the composite material, according to the present invention. Further aspects of the invention are disclosed in the specification and independent claims, preferred embodiments are disclosed in the specification and the dependent claims. The invention particularly provides for:

- A composite material comprising a matrix and embedded therein luminescent crystals (1st aspect);
- liquid or solid formulations comprising said composite material and polymer (2nd aspect);
- a component comprising said formulation and a substrate (3rd aspect);
- a device comprising said component and a source of light (4th aspect);
- uses of such composite materials, formulations, components and devices (5th aspect);
- methods for manufacturing such composite materials, formulations, components and devices (6th aspect);

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of". Percentages are given as weight-%, unless otherwise indicated herein or clearly contradicted by the context.

The term "luminescent crystals" (LC) is known in the field and relates to crystals of 3-500 nm, made of semiconductor materials. The term comprises quantum dots, typically in the range of 3-15 nm and nanocrystals, typically in the range of more than 15 nm and up to 100 nm (preferably up to 50 nm) and crystals, typically in the range more than 100 nm and up to 500 nm. Preferably, luminescent crystals are approximately isometric (such as spherical or cubic). Particles are considered approximately isometric, in case the aspect ratio (longest:shortest direction) of all 3 orthogonal dimensions is 1-2.

LCs show, as the term indicates, luminescence. In the context of the present invention the term luminescent crystal includes both, particles in the form of single crystals and polycrystalline particles. In the latter case, one particle may be composed of several crystal domains (grains), connected by crystalline or amorphous phase boundaries. A luminescent crystal is spatially separated from other particles due to the presence of the matrix. A luminescent crystal is a semiconducting material which exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechanoluminescence (e.g. piezoluminescence), chemiluminescence, electrochemi-luminescence nor thermoluminescence.

The term "solvent" is known in the field and relates to liquid organic molecules capable of dissolving solid materials.

In the context of formulations, $2^{nd}$ aspect, it particularly includes aliphatic hydrocarbons, aromatic hydrocarbons, ethers (including glycol-ethers), esters, alcohols, ketones, amines, amides, sulfones, phosphines, alkylcarbonates. The above organics can be substituted or unsubstituted by one or more substituents, for example by halogen (such as fluoro), Hydroxy, C1-4 alkoxy (such as methoxy or ethoxy) and alkyl (such as methyl, ethyl, isopropyl). The above organics include linear, branched and cyclic derivatives. There can also be unsaturated bonds in the molecule. The above compounds typically have 4-24 carbon atoms, preferably 5-12 carbon atoms, most preferably 6-10 carbon atoms.

In the context of synthesis of composites, 6th aspect, it particularly relates to polar organic solvents, such as dimethylsolfoxide (DMSO) and N-methylformamide (MFA).

The terms "surfactant", "ligand", "dispersant" and "dispersing agent" are known in the field and have essentially the same meaning. In the context of the present invention, these terms denote organic molecules, other than a solvent and other than organic ions of in formulae (I) and (II), which is used in suspensions or colloids to improve the separation of particles and to prevent agglomeration or settling. Surfactants typically contain polar functional end-groups and apolar end-groups.

The term "polymer" is known and includes organic and inorganic synthetic materials, particularly organic synthetic materials. The term "pre-polymer" shall include both, monomers and oligomers.

The term "suspension" is known and relates to a heterogeneous fluid of an internal phase (i.p.) that is a solid and an external phase (e.p.) that is a liquid. The external phase comprises one or more dispersants/surfactants, optionally one or more solvents and optionally one or more prepolymers.

The term "quantum dot" (QD) is known and particularly relates to semiconductor nanocrystals, which have a diameter typically between 3-15 nm. In this range, the physical diameter of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of LCs, defined in particular by its size and size distribution. Properties of the QDs are directly linked with these parameters.

The term "solution-processing" is known in the field and denotes the application of a coating or thin film to a substrate by the use of a solution-based (=liquid) starting material. In the context of the present invention, solution processing relates to the fabrication of commercial products, such as electronic devices, optical devices, and articles comprising (decorative) coatings and also to the fabrication of components/intermediate goods comprising a composite as described herein. Typically—the application of the suspension(s) is/are conducted at ambient conditions.

The present invention will be better understood by reference to the figures.

FIG. 1 shows the material obtained according to ex. 1, CsPbBr3@KBr, from top to bottom:

Composite material in visible light, composite material in UV light, microscope image of composite material supported on glass substrate, transmission electron microscope image of composite material.

Figure 1:
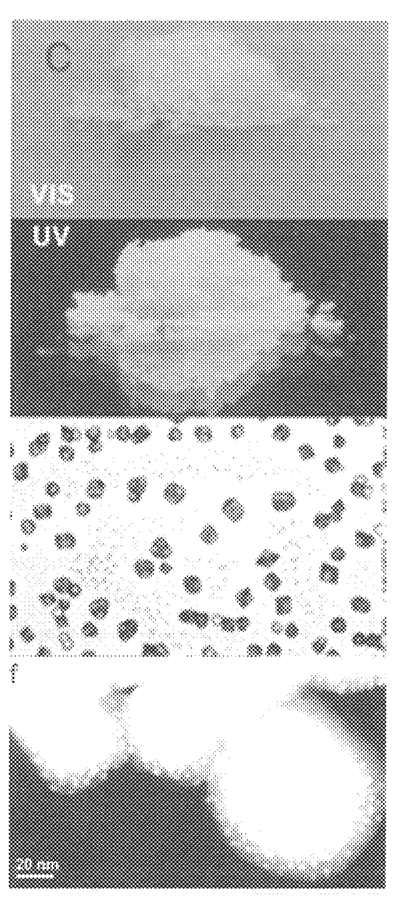

In a first aspect, the invention relates to composite materials comprising a matrix and embedded therein luminescent crystals (LCs), as defined below. It was surprisingly found that LCs within such matrix materials are stable towards oxygen and ambient humidity. It was further found that such composite materials may be processed in conventional manner, i.e. compounded with polymers to provide formulations as discussed below and to obtain components and devices as discussed below. It was also found that such composite materials may contain high concentrations of LCs allowing the manufacturing of high-performance devices. This aspect of the invention shall be explained in further detail below.

In an advantageous embodiment, the invention relates to a composite material comprising a matrix and embedded therein luminescent crystals; said luminescent crystals being selected from compounds of formula (I)

$$(M^1A^1)_a M^2_b X_c \quad \text{(I), wherein:}$$

$A^1$ represents one or more organic cations selected from the group consisting of ammonium, formamidinium, guanidinium, imidazolium, pyridinium, pyrrolidinium, protonated thiourea, $M^1$ represents one or more alkaline metal cations selected from Cs, Rb, K, Na, Li, $M^2$ represents one or more metal cations selected from the group consisting of Ge, Sn, Pb, Sb, Te and Bi, X represents one or more anions selected from the group consisting of chloride, bromide, iodide, cyanide, thiocyanate, isothiocyanate and sulfide, a represents 1-4, b represents 1-2, c represents 3-9; and said matrix being selected from compounds of formula (II)

$$M^3_d X^2_e \quad \text{(II), wherein:}$$

$M^3$ represents one or more metal cations selected from Li, Na, K, Rb, Mg, Ca, Sr, Ba, Ti, Y, Zr, Zn, and Al (preferably: Li, Na, K, Rb, Mg, Ca, Sr, Ba; most preferably: Na, K, Rb, Ca, Ba);

$X^2$ represents one or more anions selected from the group consisting of halides, pseudo-halides, perchlorate, sulfates, sulfites, phosphates and phosphites (preferably: halides, pseudo-halides, perchlorates, sulfates, phosphates), d represents 1 and e represents 1, 2 or 3, or d represents 2 and e represents 1 or 3, or d represents 3 and e represents 1 or 2.

Luminescent Crystal/Quantum Dots of Formula (I):

LCs/QDs are known and discussed above. As is apparent from the above, a wide variety of LCs may be used according to this invention. This allows tunable luminescent peak positions, typically ranging from 490-660 nm. It is particularly noted that the important range of 530 nm, corresponding to green light, can be matched with the inventive compositions.

The inventive method provides for LCs/QDs having an average size of 3-500 nm, in particular of 3-100 nm. The LCs/QDs further have a narrow size distribution, as indicated by the low FWHM values of the emission peaks.

The ratio of $M^1:A^1$ may vary broadly, to the extreme that either $M^1$ is not present (see formula (I-2)) or $A^1$ is not present (see formula (I-1).

In one embodiment, the invention relates to LCs/QDs of formula (I), where $M^1$ is present up to 90 mol % when calculated on the basis of $M^1+A^1$. In this embodiment, $M^1$ and $A^1$ are statistically distributed and relate to compounds of formula (I')

$$(M^1_{a'}A^1_{a''})_a M^2_b X_c \quad \text{(I'), wherein:}$$

a'+a''=1 and a'/(a'+a'')<0.9 and a'>0, and the remaining substituents are as defined herein. In this specification, such compounds of formula (I') are also referred to as inorganic-organic perovskites, due to the simultaneous presence of $M^1$ and $A^1$.

In one embodiment, the invention relates to LCs/QDs of formula (I), where $M^1$=Cs.

In one embodiment, the invention relates to LCs/QDs of formula (I), where $A^1$=FA or MA, preferably FA.

In one embodiment, the invention relates to LCs/QDs of formula (I), where $M^2$=Pb.

In one further embodiment, the invention relates to LCs/QDs of formula (I) further including doped materials, i.e. wherein part of $M^1$ is replaced by other alkaline metals, or wherein part of $M^2$ is replaced by other transition metals or rare earth elements, or wherein part of X is replaced by other halogenides, or wherein part of $A^1$ is replaced by other cations as defined herein. Dopants (i.e. replacing ions) are generally present in an amount of less than 5%, preferably less than 1%, in respect to the ion they are replacing.

The compounds of formula (I) include stoichiometric and non-stoichiometric compounds. Compounds of formula (I) are stoichiometric, in case a, b and c represent a natural number (i.e. positive integers); they are non-stoichiometric, in case a, b and c represent a rational number, excluding natural numbers. In one embodiment, the invention relates to LCs/QDs of formula (I), where a=1, b=1, c=3.

A wide variety of anions, or combination of anions, may be used. In one embodiment, the invention relates to LCs/QDs of formula (I), where X represents one single anion, preferably selected from the group consisting of Cl, Br and I. In one alternative embodiment, the invention relates to LCs/QDs of formula (I), where X is a combination of at least two different ions. In this case c'+c" represents a natural number from 3 to 9 and c'/c">0.9, where c' and c" represent the indices of the two different anions X. As sulfide is 2-, it counts twice when calculating c', c"

The term LCs particularly includes crystals of Perovskite structure according to formula (I) and (I'). As discussed in further detail below, LCs of formula (I) include Perovskite structures with inorganic cations of formula (I-1), Perovskite structures with organic cations of formula (I-2) and lead-free Perovskite structures of formula (I-3) with either organic or inorganic cations (or mixtures). Among the various structures of compounds of formula (I) the following were found particularly beneficial:

FAPbBr$_3$ (500-540 nm),
MAPbBr$_3$ (~530 nm)
CsPbBr$_3$ (490-520 nm),
CsPbI$_3$ (650-700 nm),
CsPbBr$_{3-x}$I$_x$ (520-700 nm), (0.1<x<3)
CsPbCl$_x$Br$_{3-x}$ (400-520 nm), (0.1<x<3)
K$_2$SnI$_6$ (~560 nm),
K$_2$SnI$_x$Br$_{6-x}$ (~560 nm), (0.2<x<6)
K$_2$SnI$_x$F$_{6-x}$ (~545 nm), (0.2<x<6)
Rb$_2$SnI$_x$Br$_{6-x}$ (~545 nm), (0.2<x<6)
Rb$_3$Sb$_2$Br$_9$ (~660 nm),

Perovskite Structures with Inorganic Cations:

In one embodiment, the invention relates to LCs/QDs of formula (I-1)

$$M^1{}_a M^2{}_b X_c \quad \text{(I-1)},$$

wherein the substituents are as defined herein. This embodiment is beneficial, as fully inorganic LC compositions can show specific advantageous with respect to manufacturing reproducibility of optical properties (emission wavelength, QY, FWHM). Furthermore, fully inorganic LC compositions can show improved chemical stability in basic environment (high pH) or when irradiated/excited with high-intensity blue light or subjected to heat treatment/stress.

Perovskite Structures with Organic Cations:

As discussed above, the amount of $M^1$ may vary over a broad range. In one embodiment, the invention relates to LCs/QDs of formula (I), where no $M^1$ is present. In this embodiment, the invention relates to compounds of formula (I-2)

$$A^1{}_a M^2{}_b X_c \quad \text{(I-2), wherein}$$

the substituents are as defined herein. As can be seen from the above formula (I-2), these compounds contain two types of cations. While cation $A^1$ is an organic cation, cation $M^2$ is a metal cation. In this specification, such compounds of formula (I-2) are termed organic perovskites, due to the absence of $M^1$. Such hybrid materials, particularly in the form of Perovskite luminescent crystals, have beneficial properties. A broad range of hybrid materials (I) comprising organic cations $A^1$ are known and suitable for the composite materials described herein. This embodiment is beneficial, as compositions with organic cations can show very high QY (especially at around 520-540 nm emission). Additionally, PL intensity is less temperature dependent compared to Cs-based compositions which can be advantageous for specific applications.

Suitable organic cations $A^1$ may be selected from the group consisting of formamidinium cations (IV-1), ammonium cations (IV-2), guanidinium cations (IV-3), protonated thiourea cations (IV-4), imidazolium cations (IV-5), pyridinium cations (IV-6), pyrrolidinium cations (IV-7), (IV-1)

(IV-2)

(IV-3)

(IV-4)

(IV-5)

(IV-6)

(IV-7)

wherein the substituents R represents, independent from each other, hydrogen, or $C_{1-4}$ alkyl, or phenyl, or benzyl and in case R is connected to carbon it additionally represents independent from each other halide or pseudohalide.

For (IV-1), $R^2$ preferably represents hydrogen; and $R^1$ preferably represents methyl or hydrogen or halide or pseudohalide. Preferred cations are selected from the group consisting of the acetamidinium, formamidinium (FA). FA is the preferred cation.

For (IV-2), R preferably represents hydrogen and methyl, ethyl, n-propyl, iso-propyl, n-butyl, iso-butyl, tert-butyl, phenyl, benzyl. Preferred cations are selected from the group consisting of benzylammonium, iso-butylammonium, n-butylammonium, t-butylammonium, diethylammonium, dimethylammonium, ethylammonium, methylammonium (MA), phenethylammonium, iso-propylammonium, n-propylammonium. MA and FA, particularly MA, is the preferred cation.

For (IV-3), $R^2$ preferably represents hydrogen, resulting in the parent compound, the guanidinium cation.

For (IV-4), $R^2$ preferably represents hydrogen, resulting in the parent compound, the protonated thiourea cation.

For (IV-5), $R^2$ preferably represents methyl or hydrogen. Imidazolium is the preferred cation.

For (IV-6), $R^2$ preferably represents methyl or hydrogen. Pyridinium is the preferred cation.

For (IV-7), R preferably represents methyl or hydrogen. Pyrrolidinium is the preferred cation.

In one further embodiment the invention relates to LCs/QDs of formula (I-2), selected from $$A^1SnX_3, \quad (I\text{-}2.1)$$

$$A^1_2SnX_6, \quad (I\text{-}2.2)$$

$$A^1_3Sb_2X_9, \quad (I\text{-}2.3)$$

$$A^1_3Bi_2X_9, \quad (I\text{-}2.4) \text{ and}$$

$$A^1GeX_3, \quad (I\text{-}2.5)$$

wherein the substituents are as defined herein.

Lead-Free Perovskite Structures:

In one embodiment, the invention relates to LCs/QDs of formula (I-3).

$$(M^1A^1)_aM^2_bX_c \quad (I\text{-}3), \text{ wherein}$$

$M^2$ is selected from Ge, Sn, Sb, Te and Bi, preferably Sn and Sb, and the remaining substituents are as defined herein. This embodiment is beneficial, as the resulting materials are lead-free and thus are in best compliance with environmental standards.

It is understood that the presence of $A^1$ is mandatory for compounds of formula (I-2) and optional for compounds of formula (I) and (I-3) and excluded for compounds of formula (I-1). The compounds of formula (I-2) according to this invention are therefore termed perovskites with organic cations.

In one further embodiment the invention relates to LCs/QDs of formula (I-3), selected from $$A^1SnX_3, \quad (I\text{-}3.1)$$

$$A^1_2SnX_6, \quad (I\text{-}3.2)$$

$$A^1_3Sb2X_9, \quad (I\text{-}3.3)$$

$$A^1_3Bi2X_9, \quad (I\text{-}3.4) \text{ and}$$

$$A^1GeX_3 \quad (I\text{-}3.5)$$

wherein the substituents are as defined herein.

Matrix:

The term is known in the field. It was found that a careful selection of matrix materials allows to stabilize the LCs/QDs discussed above. In view of the intended use, it is preferred that the matrix does not absorb light in the visible spectrum. The matrix material contains (i.e. it comprises, or consists of) an inorganic salt, preferably as disclosed in formula (II)

$$M^3_dX^2_e \quad (II), \text{ wherein:}$$

$M^3$ represents one or more metal cations selected from Li, Na, K, Rb, Mg, Ca, Sr, Ba, Ti, Y, Zr, Zn, and Al;

$X^2$ represents one or more anions selected from the group consisting of halides, pseudohalides, perchlorates, sulfates, sulfites, phosphates and phosphites;

d represents 1 and e represents 1, 2 or 3, or d represents 2 and e represents 1 or 3, or d represents 3 and e represents 1 or 2.

$M^3$ preferably represents a metal selected from the group consisting of Li, Na, K, Rb, Mg, Ca, Sr, and Ba. $M^3$ particularly preferably represents a metal selected from the group consisting of Na, K, Rb, Ba and Ca.

$X^2$ preferably represents an anion selected from halides, pseudo-halides, perchlorates, sulfates and phosphates. Most preferably halides.

Halides include fluoride, chloride, bromide, and iodide. Pseudohalides include polyatomic analogues of haldies, whose chemistry resembles that of the halides and allows them to substitute for halides as anions in inorganic salts of formula (II). Pseudohalides are known to the skilled person and include $CN^-$, $N_3^-$, $(OCN)^-$, $(CNO)^-$, $(SCN)^-$, $(SeCN)^-$; particularly $NCO^-$ (Cyanate), $SCN^-$ (Thiocyanate), $NCS^-$ (Isothiocyanate). Perchlorates include $ClO_4^-$.

Sulfates include $SO_4^{2-}$, and $HSO_4^-$. Sulfites include $SO_3^{2-}$, and $HSO_3^-$.

Phosphates includes $PO_4^{3-}$, $HPO_4^{2-}$, $H_2PO_4^-$. Phosphites include $HPO_3^{2-}$, $H_2PO_3^-$.

Matrix materials include stoichiometric and non-stoichiometric compounds of formula (II). In one embodiment, the matrix is a stoichiometric compound. In one further embodiment, the matrix is a non-stoichiometric compound. In this embodiment, crystal positions of cation and/or anion are replaced by/doped with other elements.

The term matrix particularly includes inorganic salts according to formula (II). As discussed in further detail below, matrices of formula (II) include halides/pseudohalides/perchlorates of formula (II-1), sulfates/sulfites of formula (II-2) and phosphates/phosphites of formula (II-3).

Halides, Pseudohalides, Perchlorates:

In one embodiment, the invention relates to composite materials wherein the matrix is selected from compounds of formula (II-1)

$$M^3_dX^2_e \quad (II\text{-}1), \text{ wherein}$$

$X^2$ represents one or more anions selected from the group consisting of halides, pseudo-halides, perchlorates, $M^3$ represents a cation as defined above, d represents 1 and e represents 1, 2 or 3.

Accordingly, this class of matrix materials includes halides of formula (II-Ia) where $X^2$=halide; pseudo-halides of formula (II-Ib) where $X^2$=pseudo-halide and perchlorates of formula (II-Ic) where $X^2$=$ClO_4^-$.

Sulfates/Sulfites:

In one embodiment, the invention relates to composite materials wherein the matrix is selected from compounds of formula (II-2)

$$M^3_dX^2e \quad (II\text{-}2), \text{ wherein}$$

$X^2$ represents one or more anions selected from the group consisting of sulfates and sulfites, preferably from $SO_4^{2-}$,
$M^3$ represents a cation as defined above
d and e are as defined above.

Phosphates/Phosphites:

In one embodiment, the invention relates to composite materials wherein the matrix is selected from compounds of formula (II-3)

$$M^3{}_d X^2{}_e \quad \text{(II-3), wherein}$$

$X^2$ represents one or more anions selected from the group consisting of phosphates and phosphites, preferably from $PO_4^{3-}$,
$M^3$ represents a cation as defined in claim 1
d and e are as defined in claim 1.

Among the various structures of compounds of formula (II) the following were found particularly beneficial:
NaBr, KBr, RbBr, CsBr, $BaBr_2$, $CaBr_2$
KI, NaI
$Na_2SO_4$.

Composite Material:

According to this invention, a multitude of LCs are embedded within a matrix. The term "embedding" denotes that most of the LCs are within the matrix, but some LCs may be located on the surface of the matrix.

It was found that the LCs are protected against degradation by oxygen or humidity. This comes as a surprise, as the matrix materials are water soluble.

It was further found that the LCs may be present in high concentrations, such as more than 1 wt %, preferably more than 10 wt. %. This results in high luminescence, which is obviously a desirable property.

It was further found that the composite materials are easy to manufacture and easy to compound into polymer materials; again very desirable properties. It is therefore possible to avoid additives, such as surfactants, capping agents or ligands. In one embodiment, the invention thus relates to composite materials as described herein, free of, or essentially free of, organic molecules, and in particular free of surfactants, ligands and capping agents. The term "organic molecules" relates to compounds different than compounds of formula (I) and (II) and is therefore not to be confused with the organic cations $A^1$ referred-to in the context of LCs of formula (I). In a further embodiment, the invention thus relates to composite materials as described herein, consisting of a plurality of LCs as disclosed herein embedded in a matrix as disclosed herein. The combination of these features make the composite materials described herein very attractive for a number of applications/uses, as discussed below.

The molar ratio LCs (I):matrix (II) may vary over a broad range; suitable are 0.1-50 mol %; preferably 1-50 mol %; most preferably 1-20 mol % of LC in the composite material. Thus, very high amounts of LCs, up to 50 mol. % may be stabilized with the matrix materials as disclosed herein. This is considered a significant advantage when compared to the prior art. As an initial benefit of these high amounts of LCs in the composite material, high intensities and also high quantum yields (up to 90%) are observed.

The composite material is typically present in particulate form. In one embodiment, the invention provides for composite material as described herein, wherein said material is present as a population of microparticles. Such microparticles are preferably 50-200'000 nm in diameter, particularly preferably: 50-5'000 nm in diameter. In one embodiment, the invention provides for composite material as described herein, wherein said LCs are of size 3-500 nm, preferably: 3-100 nm, particularly preferably: 3-50 nm. In one embodiment, the invention provides for composite material as described herein, wherein the LC's size is at most ⅕ of the composite's size, preferably: ¹/₁₀ the composite's size. As the composite material is typically present in particulate form, such as the microparticles above, it is beneficial if the LC's are ⅕ of this size, or smaller, to allow efficient embedding in the matrix.

In a second aspect, the invention relates to a formulation comprising the composite material and polymers or pre-polymers. This aspect of the invention shall be explained in further detail below. Preferably, the composite material is homogeneously distributed within said formulation.

In one embodiment, the invention provides for a formulation containing
composite material as described herein, polymer and optionally solvent; or
composite material as described herein, pre-polymer and optionally solvent; or
composite material as described herein, pre-polymer, polymer and optionally solvent.

Polymer:

The term polymer is defined above. Advantageously, the polymer is selected from the group of acrylate polymers, carbonate polymers, sulfone polymers, epoxy polymers, vinyl polymers, urethane polymers, styrene polymers, silicone polymers and cyclic olefin copolymers.

Pre-Polymer:

The term pre-polymer is defined above. Advantageously, the pre-polymer is selected from the group of acrylates, epoxies, urethanes, esters, and silicones. Preferably, the pre-polymer is selected from the group of acrylates, urethanes, epoxies and silicones. Particularly preferably, the pre-polymer is selected from the group of acrylates, epoxies and silicones.

Solvent:

The term solvent is defined above. Advantageously, the solvent is selected from the group of hydrocarbons (including linear, branched and cyclic hydrocarbons), aromatic hydrocarbons, ethers (including glycol-ethers), esters, alcohols, ketones. Preferably the solvent is selected from apolar solvents such as aliphatic, aromatic, ethers.

The amount of components within the inventive formulations may vary over a broad range and depends inter alia on its intended use and the nature of the composite material. Typically, the amount of LCs/QDs is 100 ppm or more. In one embodiment, the invention provides for a formulation as described herein, wherein said composite material is present in an amount of 1-60 wt %, preferably in an amount of 5-50 wt %.

The above formulations may be liquid or solid. Typically, the formulations are liquid prior to manufacturing a component, the finished component contains a solid formulation.

In one embodiment the invention provides for formulations where the quantum yield thereof is >60%, FWHM is <30 nm and emission wavelength is 520-540 nm.

The formulations as described herein find many applications as detailed below; they are particularly useful for manufacturing components/devices that convert light.

In a third aspect, the invention relates to a component (also termed an intermediate good) comprising the formulation as described herein and a substrate. This aspect of the invention shall be explained in further detail below.

In an embodiment, the invention relates to a component comprising a substrate and a multitude of layers wherein at least one of said layers comprises a formulation as described herein Such layer, containing a solid formulation as described herein, is also referred to as a functional layer.

In an embodiment, the invention relates to a component comprising a sheet-like substrate coated with one or more layers, wherein at least one of said layers is a functional layer, i.e. a layer containing a solid formulation as described above.

In an embodiment, the invention thus relates to a component as described herein, free of barrier layer. Due to the stability of the composite material, it is possible to omit barrier films in the components disclosed herein. It is a significant benefit of this invention to provide components comprising a functional layer that are free of barrier films. Until now, such barrier films are used in commercial components and devices to ensure long-term stability. The barrier films, however, amount to a significant portion of the total costs and to additional production steps.

In an embodiment, the component is a backlight film, particularly a backlight film free of a barrier layer. Such backlight film may be used for a liquid crystal display for emitting white light. For this purpose, a blue light source may be provided in the device for exciting luminescent reactions in the active layer described herein. In case the substrate is of light transmissive property for light in the visible spectrum, the luminescent component may emit white light resulting as a combination of the emission of red and green light in response to an excitation of the luminescent crystals in the active layer, and from the transmission of the blue light stemming from the light source which blue light is also used to excite the LCs. An intensity proportion of the red, green and blue light emitted preferably is in the range of a ⅓ each. In this context, the luminescent component may be used as a backlight film for a liquid crystal display, according to another aspect of the present invention.

In an embodiment, functional layer converts blue light into white light. The invention thus provides for the use of a component for converting blue light into white light, particularly with the use of a light emitting diode (LED) in an OLED display or in a liquid crystal display.

In an embodiment, functional layer converts blue light into red light, In an embodiment, functional layer converts blue light into green light.

In a forth aspect, the invention relates to novel devices/articles comprising the component or formulation or composite material as described herein and a source of light. This aspect of the invention shall be explained in further detail below.

In one embodiment, the invention provides for a device, selected from the group of light emitting diode (LED), a QLED-, Organic Light Emitting Diode (OLED), or Liquid Crystal Display (LCD). Such devices are known per se, but not containing the composite materials as described herein. These composite materials are used to convert light and are therefore present as the functional layer (or active layer) in such a device. As part of an OLED, LED or LCD, the component may contribute to a display of a mobile or stationary computing, telecommunication, or television device.

A one embodiment, the invention provides for a light emitting device, comprising a luminescent component as described herein, a light source for emitting blue light, the light source being arranged for exciting the luminescent component.

In a fifth aspect, the invention relates to uses of inorganic salts, composite material, formulations, components and devices as described herein. The inventive uses are mainly based on the high performance, high stability and simple manufacturing of the composite materials as discussed above ($1^{st}$ aspect). This aspect of the invention shall be explained in further detail below.

In one embodiment, the invention relates to the use of inorganic salts of formula (II), as disclosed above, as a matrix material (embedding material) for luminescent crystals, particularly for luminescent crystals of formula (I), as disclosed above. As discussed above, it comes as a surprise that these inorganic salts improve stability of luminescent crystals and maintain their performance over prolonged periods of time.

In one further embodiment, the invention relates to the use of a composite material according to the $1^{st}$ aspect of the invention, or a formulation according to the $2^{nd}$ aspect of the invention, or a component according to the $3^{rd}$ aspect of the invention in a light emitting device, such as a QLED, an OLED or an LCD. The use particularly pertains to the use in manufacturing such device. As discussed above, the beneficial properties of the composite materials are retained throughout the manufacturing steps the devices obtained are superior over known devices, or the devices obtained are comparable to known devices but simpler in manufacturing.

In one further embodiment, the invention relates to the use of a composite material according to the $1^{st}$ aspect of the invention, or a formulation according to the $2^{nd}$ aspect of the invention, or a component according to the $3^{rd}$ aspect of the invention for converting blue light into white light.

In one further embodiment, the invention relates to the use of a composite material according to the $1^{st}$ aspect of the invention, or a formulation according to the $2^{nd}$ aspect of the invention, or a component according to the $3^{rd}$ aspect of the invention for converting light of a given frequency into light with a lower frequency; particularly for converting blue light into white light of for converting blue light into red light or for converting blue light into green light.

In a sixth aspect, the invention relates to a method of manufacturing composite material, formulations, components and devices as described herein. This aspect of the invention shall be explained in further detail below.

Manufacturing of Composite Material:

The invention relates to a method for manufacturing composite materials as disclosed herein based on the concept of concomitant crystallization. The invention thus relates to the manufacturing of composite materials as disclosed herein comprising the step of concomitant crystallization of compounds of formula (I) and compounds of formula (II) from a solution comprising the cations and anions in the appropriate molar amounts. By such concomitant crystallization the in situ embedding of LCs of formula (I) into robust inorganic matrixes of formula (II) is achieved. It is considered beneficial, that this approach of concomitant crystallization does not require colloidal synthesis of LCs and their processing.

It was surprisingly found that the composites initially obtained by this manufacturing method are typically in the form of microcrystalline powders and resemble all outstanding optical properties of colloidal LCs, including photoluminescence (PL) quantum yields approaching 90-100%, color purity and tunability in a whole visible range.

It was further found that such in situ embedding of the LCs (I) into inorganic robust matrixes (II) enables outstanding stability of LCs and their optical properties.

In one embodiment, the invention provides for a method for manufacturing a composite material as described herein, comprising the steps of (a) providing a solution comprising starting materials and solvent; (b) annealing said composition; (c) optionally further steps.

Step (a): The starting material provided has a chemical composition that corresponds to the chemical composition of the desired composite material. Accordingly, such solid material has a stoichiometric composition of a moles ($A^1$+ $M^1$), b moles $M^2$ and c moles X, PLUS an excess amount of a stoichiometric composition of d moles $M^3$ and e moles $X^2$. These starting materials are dissolved in a solvent or solvent combination.

Step (b) Crystallisation: The step of crystallization may be performed in any known manner. Advantageously, it is effected by annealing the solution of step a.

Step (c) Finishing: The as-synthesized composite materials may be subject to post-processing, such as outlined below in steps (c-1), (c-2) and (c-3).

In one embodiment of such post-processing two or more types of composites are mixed. By mixing different types of composites, the composition is tuned. (c-1)

In one further embodiment, composites of the present invention may be purified from excess solvent or other by-products, e.g. by diafiltration of synthesized composites. (c-2)

In a further embodiment, the LCs/QD particle size/size distribution may be tuned be e.g. sieving or milling. (c-3)

Manufacturing of Formulation:

The invention also relates to a method of manufacturing formulations as described herein. This manufacturing may follow known routes by combining the composite materials with polymers, pre-polymers and/or solvent.

Manufacturing of Components:

The invention also relates to a method of manufacturing components as described herein. The components according to the present invention may be obtained by solution processes. This is considered a significant advantage, as it enables manufacturing of all layers by simple technologies applicable to large areas and continuous processing. Accordingly, the invention also provides methods for manufacturing a component as described herein, said method comprising the step of providing a substrate and depositing a formulation as described herein on said substrate, preferably by coating or printing of a formulation as described herein followed by drying and/or curing.

Manufacturing of Devices:

The invention also relates to a method of manufacturing electronic devices as described herein. The manufacturing of devices starting from the above described components is known per se, but not yet applied to the specific components of the present invention. Accordingly, the invention provides for the manufacturing of a devices as disclosed herein comprising the step of assembling one or more components as described herein with further components to obtain a device. These further components are components conventional in the field.

To further illustrate the invention, the following examples are provided. These examples are provided with no intent to limit the scope of the invention.

Synthesis—General:

If not stated otherwise, all of the chemicals were purchased from Aldrich and used without further treatment. Stoichiometric amounts of the starting materials are dissolved in a suitable solvent, preferably a high-boiling, polar organic solvent (e.g. DMSO, MFA). The solution is poured on a heating plate to dry/anneal the solution and thereby obtain the composite material as a luminescent powder.

Typical synthesis is as simple as following: $CsBr:PbBr_2$:KBr (1:1:70 molar ratio) solution in organic solvent (dimethylsolfoxide:N-methylformamide, DMSO:MFA=3:7) was drop-casted on a hot (130° C.) glass substrate and allowed to anneal 3 minutes after complete solvent evaporation. After that material was allowed to cool down naturally. Overall synthesis takes ~5 minutes and results in homogeneous microcristalline powder.

Optical microscopy shows only faceted microcrystals pretending to have tetrahedral habit which one could expect for KBr. All these microcrystals are nearly transparent under illumination with visible light but show same bright green luminescence under UV-excitation.

Scanning transmission electron microscopy in high-angle angular dark field mode confirms that in $CsPbBr_3$@KBr sample nearly spherical heavy LCs are localized inside matrix of light-elements. Energy-dispersive X-ray spectroscopy implies that matrix has to consist of alkali bromide whereas bright NCs are Pb-based. At the same time conventional powder X-ray diffraction confirms that that synthesized composite materials consist primarily of well-crystallized alkali halides and do not show any signal of crystalline $CsPbBr_3$, indicating that it is present in LC form. Homogeneity of crystallites in microphotographs and uniform distribution of their PL imply that these LCs have to be distributed inside or on the surface of bulk alkali bromide matrix.

$CsPbBr_3$ LCs synthesized in RbBr matrix behave in analogous manner though show blueish PL.

According to this procedure, composite materials according to the following tables were obtained.

TABLE 1

LC of formula (I) = $CsPbBr_3$. The table identifies the matrix (II); molar ratio of matrix (II):LC (I), intensity of luminescence $i_L$, peak position [nm], quantum yield [%] and FwHM [nm].

| matrix (II) | $n_{Matrix}:n_{NC}$ | $i_L$ | Peak [nm] | QY [%] | FWHM [nm] |
|---|---|---|---|---|---|
| INVENTIVE | | | | | |
| RbBr | (1:1)-(6:1) | Medium | ~515 | | |
|  | (6:1)-(12:1) | High | 510-515 | | |
|  | (12:1)-(50:1) | Medium | 503-510 | | |
|  | (50:1)-(100:1) | low | 490-503 | | |
| KBr | (1:1)-(20:1) | medium | ~515 | <50 | 25-28 |
|  | (20:1)-(80:1) | high | ~515 | up to 90 | 25-28 |
|  | (80:1)-(100:1) | high | 510-515 | 70-80 | 25-30 |
|  | (100:1)-(1000:1) | low | 490-510 | ~60 | 30-40 |
| $Na_2SO_4$ | (5:1)-(30:1) | medium | ~515 | | |
| COMPARATIVE | | | | | |
| CsBr | (1:1)-(20:1) | low | 510-520 | 1-70 | ~22 |

CsPbBr3 was chosen as a classical LC of formula (I-1). The data show that high performing LCs are obtained when using matrix materials according to the invention. When using the non-inventive matrix material CsBr, very little luminescence is observed. This may be attributed to side reactions, such as formation of Cs4PbBr6, which reduces amount of available Pb cations forming LCs.

TABLE 2

LC (I) = FAPbBr3 (FA = formamidinium; starting material:formamidinium bromide). The headings are as defined in table 1.

| matrix (II) | $n_{Matrix}:n_{NC}$ | $i_L$ | Peak [nm] | QY [%] | FWHM [nm] |
|---|---|---|---|---|---|
| INVENTIVE | | | | | |
| NaBr | (1:1)-(10:1) | medium | 535-540 | 10-50 | ~30 |
|  | (10:1)-(40:1) | high | 530-535 | 50-70 | ~30 |
|  | (40:1)-(70:1) | low | 500-530 | | |

TABLE 2-continued

LC (I) = FAPbBr3 (FA = formamidinium;
starting material:formamidinium bromide). The
headings are as defined in table 1.

| matrix (II) | $n_{Matrix}:n_{NC}$ | $i_L$ | Peak [nm] | QY [%] | FWHM [nm] |
|---|---|---|---|---|---|
| KBr | (1:1)-(4:1) | medium | 535-540 | <10 | ~30 |
|  | (4:1)-(7:1) | high | 530-535 | 10-60 | ~30 |
|  | (7:1)-(30:1) | low | 500-530 |  |  |
| COMPARATIVE |  |  |  |  |  |
| CsBr | (1:1)-(20:1) |  | Formation of purely FAPbBr3 LCs is not possible |  |  |

FAPbBr3 was chosen as a classical LC of formula (I-2). The data show that high performing LCs are obtained when using matrix materials according to the invention. When using the non-inventive matrix material CsBr, the formation of purely FAPbBr$_3$ LCs is not possible due to partial exchange of FA with Cs in formula (I-2).

TABLE 3

The headings are as defined in table 1.

| LC (I) | matrix (II) | $n_{Matrix}:n_{NC}$ | $i_L$ | Peak [nm] | QY [%] | FWHM [nm] |
|---|---|---|---|---|---|---|
| INVENTIVE |  |  |  |  |  |  |
| K$_2$Sn (Br$_{1-x}$I$_x$)$_6$ | K (Br$_{1-x}$I$_x$) | (4:1)-(30:1) | medium | ~560 |  | ~100 |
| K$_2$SnI$_6$ | KI | (4:1)-(30:1) | medium | ~560 |  | ~100 |
| K$_2$Sn (F$_{1-x}$I$_x$)$_6$ | K (F$_{1-x}$I$_x$) | (4:1)-(30:1) | medium | ~545 |  | ~100 |
| Rb$_2$Sn (Br$_{1-x}$I$_x$)$_6$ | Rb (Br$_{1-x}$I$_x$) | (4:1)-(30:1) | medium | ~545 |  | ~100 |
| Rb$_3$SbBr$_9$ | RbBr | (100:1) | low | ~660 |  | ~160 |
| COMPARATIVE |  |  |  |  |  |  |
| K$_2$SnI$_6$ | CsI | (1:1)-(20:1) | none | 0 |  |  |

A number of Pb-free LCs according to formula (I-3) were chosen. Also, various matrix materials of formula (II-1) were chosen, including stoichiometric and non-stochiometric compounds. The data show that high performing LCs are obtained when using matrix materials according to the invention. When using the non-inventive matrix material CsI, no luminescence is observed. To the opposite, strongly absorbing composite material is obtained. This may be attributed to side reactions, such as formation of Cs2SnI6 and/or CsSnI3.

It was further found that the inventive composite materials retain their luminescence over a prolonged period of time. The table below summarizes the improved stability by providing data on loss of photoluminescence after exposing the composite materials for a period of 4 hrs to 100° C.

TABLE 4

PL-drop of composite materials 100° C.@4 hrs.

| LC (I) | matrix (II) | $n_{Matrix}:n_{LC}$ | PL-drop [%] |
|---|---|---|---|
| INVENTIVE |  |  |  |
| CsPbBr$_3$ | KBr | 70:1 | 20 |
| MAPbBr$_3$ | NaBr | 30:1 | 20 |
| COMPARATIVE |  |  |  |
| MAPbBr$_3$ | NaNO$_3$ | 7:1 | 70 |

The inventive composites retained 80% of its initial photoluminescence. The prior art retained only 30% of its initial photoluminescence, see Yang et al (discussed above) FIG. 4b. It is particularly noted that the change in matrix material, from NaNO$_3$ (known) to NaBr (inventive) provides such a remarkable improvement.

The invention claimed is:

1. A composite material comprising a matrix and embedded therein luminescent crystals;
said luminescent crystals being selected from compounds of formula (I)

$$(M^1A^1)_aM^2{}_bX_c \quad \text{(I), wherein}$$

A$^1$ represents one or more organic cations selected from the group consisting of ammonium, formamidinium, guanidinium, imidazolium, pyridinium, pyrrolidinium, protonated thiourea,
M$^1$ represents one or more alkaline metal cations selected from Cs, Rb, K, Na, Li,
M$^2$ represents one or more metal cations selected from the group consisting of Ge, Sn, Pb, Sb, Te and Bi,
X represents one or more anions selected from the group consisting of chloride, bromide, iodide, cyanide, thiocyanate, isothiocyanate and sulfide,
a represents 1-4,
b represents 1-2,
c represents 3-9; and
said matrix being selected from compounds of formula (II)

$$M^3{}_dX^2{}_e \quad \text{(II), wherein}$$

M$^3$ represents one or more metal cations selected from Li, Na, K, Rb, Mg, Ca, Sr, Ba, Ti, Y, Zr, Zn, and Al,
X$^2$ represents one or more anions selected from the group consisting of halides, pseudo-halides, perchlorates, sulfates, sulfites, phosphates and phosphites,
d represents 1 and e represents 1, 2 or 3, or
d represents 2 and e represents 1 or 3, or
d represents 3 and e represents 1 or 2,
said composite material being present as a population of microparticles having a diameter in the range of 50-200,000 nm, and wherein the compounds of formula (I) are present in a concentration of more than 10 wt %.

2. The composite material according to claim 1, wherein the luminescent nanocrystals being selected from compounds of formula (I-1)

$$M^1{}_aM^2{}_bX_c \quad \text{(I-1), wherein}$$

the substituents are as defined in claim 1; and/or
from compounds of formula (I-2)

$$A^1_a M^2_b X_c \tag{I-2}$$

wherein the substituents are as defined in claim 1; and/or
from compounds of formula (I-3)

$$(M^1 A^1)_a M^2_b X_c \tag{I-3}$$

wherein $M^2$ is selected from Ge, Sn, Sb, and Bi.

3. The composite material according to claim 1 wherein the matrix being selected from compounds of formula (II-1a)

$$M^3 X^2_e \tag{II-1a}$$

wherein
$X^2$ represents one or more anions selected from the group consisting of halides,
$M^3$ represents a cation as defined in claim 1,
e represents 1, 2 or 3; and/or
compounds of formula (II-1b)

$$M^3 X^2_e \tag{II-1b}$$

wherein
$X^2$ represents one or more anions selected from the group consisting of pseudohalides, particularly $(NCO)^-$ and $(SCN)^-$,
$M^3$ represents a cation as defined in claim 1,
e represents 1, 2 or 3; and/or
compounds of formula (II-1c)

$$M^3(ClO_4)_e \tag{II-1c}$$

wherein
$M^3$ represents a cation as defined in claim 1,
e represents 1, 2 or 3; and/or
compounds of formula (II-2)

$$M^3_d X^2_e \tag{II-2}$$

wherein
$X^2$ represents one or more anions selected from the group consisting of sulfates,
$M^3$ represents a cation as defined in claim 1
d and e are as defined in claim 1; and/or
compounds of formula (II-3)

$$M^3_d X^2_e \tag{II-3}$$

wherein
$X^2$ represents one or more anions selected from the group consisting of phosphates.

4. The composite material according to claim 1, wherein said luminescent crystals of formula (I) are of 3-500 nm in diameter; and/or
the size of luminescent crystals of formula (I) is at most ⅕ of the size of the composite material.

5. The composite material according to claim 1, wherein the amount of luminescent crystals of formula (I) is in the range of 0.1-50 mol %; and/or
the composite material is free of, or essentially free of, organic molecules.

6. The composite material according to claim 1, wherein said composite material is free of organic molecules.

7. A formulation comprising (i) composite material according to claim 1; (ii) a polymer and/or pre-polymer and (iii) optionally solvent.

8. The formulation according to claim 7, wherein
said polymer is selected from the group consisting of acrylate polymers, carbonate polymers, sulfone polymers, epoxy polymers, vinyl polymers, urethane polymers, styrene polymers and silicone polymers and cyclic olefin copolymers;
said pre-polymer is selected from the group consisting of acrylates, epoxies, urethanes, esters, and silicones; and
said optional solvent is selected from the group consisting of aliphatic hydrocarbons, aromatic hydrocarbons, ethers, esters, alcohols, ketones.

9. The formulation according to claim 7, wherein said composite material
is present in an amount of 1-60 wt %; and/or
is homogeneously distributed within said formulation.

10. A component comprising a substrate and a multitude of layers wherein at least one of said layers comprises a formulation according to claim 7.

11. The component of claim 10 which is devoid of a barrier layer.

12. An optoelectronic device comprising a source of light and
a composite material according to claim 1.

13. The device according to claim 12, selected from the group consisting of light emitting diode, in a QLED-, OLED-, or liquid crystal display.

14. A method for manufacturing a composite material according to claim 1, comprising the step of concomitant crystallization of compounds of formula (I) and compounds of formula (II)

$$(M^1 A^1)_a M^2_b X_c \tag{I}$$

$$M^3_d X^2_e \tag{II}$$

from a solution comprising a solvent and a moles ($A^1$+ $M^1$), b moles $M^2$, c moles X, d moles $M^3$ and e moles $X^2$,
wherein the molar ratio of the compounds of formula (I):the compounds of formula (II) is in the range of 0.1-50 mol %.

15. An optoelectronic device comprising a source of light and a formulation according to claim 7.

16. An optoelectronic device comprising a source of light and a component according to claim 10.

* * * * *